(12) United States Patent
Moriwaki et al.

(10) Patent No.: US 6,570,774 B1
(45) Date of Patent: May 27, 2003

(54) CAPACITOR MODULE FOR USE IN INVERTER, INVERTER, AND CAPACITOR MODULE

(75) Inventors: Nobushige Moriwaki, Izumo (JP); Shigeki Nishiyama, Izumo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/526,766

(22) Filed: Mar. 16, 2000

(30) Foreign Application Priority Data

Dec. 20, 1999 (JP) .......................... 11-361548

(51) Int. Cl.⁷ .................. H05K 7/02; H05K 7/06; H05K 7/08; H05K 7/10
(52) U.S. Cl. ............... 361/760; 361/761-762; 361/763; 361/766; 361/772-774; 361/782; 361/777; 361/807; 174/260
(58) Field of Search .................. 361/760-761, 361/763, 766, 832, 837, 765, 772-774, 782, 777, 807, 811; 174/260, 263, 261

(56) References Cited

U.S. PATENT DOCUMENTS

| | | | | |
|---|---|---|---|---|
| 3,953,664 A | * | 4/1976 | Tsunashima | 174/264 |
| 4,242,719 A | * | 12/1980 | Conley | 361/760 |
| 5,036,431 A | * | 7/1991 | Adachi et al. | 361/412 |
| 5,132,896 A | * | 7/1992 | Nishizawa et al. | 363/144 |
| 5,773,880 A | * | 6/1998 | Ohno | 257/679 |
| 6,046,911 A | * | 4/2000 | Dranchak et al. | 361/784 |
| 6,185,105 B1 | * | 2/2001 | Inoguchi | 361/760 |

FOREIGN PATENT DOCUMENTS

| | | |
|---|---|---|
| JP | 63157677 | 6/1988 |
| JP | 65847 | 1/1994 |
| JP | 779576 | 3/1995 |
| JP | 9135565 | 5/1997 |
| JP | 1198815 | 4/1999 |

* cited by examiner

*Primary Examiner*—David Martin
*Assistant Examiner*—Thanh Y. Tran
(74) *Attorney, Agent, or Firm*—Keating & Bennett, LLP

(57) ABSTRACT

The present invention provides a small-sized capacitor module for use in an inverter, which is capable of suppressing the occurrence of unwanted inductance components in an electric connection path and which is suitable for a large current use. The present capacitor module is constituted by: mounting a plurality of ceramic capacitors 3 having first and second terminals 3a and 3b on the first surface 1 of a substrate 2; forming a first conductor 12 on the first surface of the substrate 2; forming a second conductor 14 on the second surface of the substrate 2; electrically connecting first and second terminals 3a and 3b to the first conductor 12 and the second conductor 14, respectively; forming, on the substrate 2, first and second terminal mounting portions where the respective first and second terminals of a switching module are mounted; and electrically connecting the first and second terminal mounting portions to the first and second conductors 12 and 14, respectively.

18 Claims, 8 Drawing Sheets

CAPACITOR MODULE FOR USE IN INVERTER, INVERTER, AND CAPACITOR MODULE

BACKGROUND OF THE INVENTION

1. Field of the Invention

The present invention relates to a capacitor module for use in an inverter device, an inverter, and a capacitor module, and more particularly to a capacitor module for use in an inverter, an inverter, and a capacitor module that are suitably used for a power module and the like.

2. Description of the Related Art

An inverter comprises a switching element and a capacitor. As shown in FIG. 10, the terminal 52 of a capacitor 51 is electrically connected to a switching element 53. Although only a single terminal 52 is shown in FIG. 10, a pair of terminals having polarities different from each other are each connected to the switching element 53. In a real inverter, the capacitor 51 and the switching element 53 are installed in an insulative housing (not shown).

As in the case of other electronic equipment or electronic components, inverters are also required to be reduced in size. Japanese Unexamined Patent Publication No. 9-308265 discloses an inverter device for use in an electric car that is of a structure having a small footprint so as to permit an effective use of the space for installation.

In the above-mentioned prior art inverter, a smoothing capacitor is disposed above a switching module by bending an input conduction plate connected to the input terminal portion of the switching module, and connecting the smoothing capacitor consisting of an electrolytic capacitor to the input conduction plate bent. Herein, since the smoothing capacitor consisting of a relatively large-sized electrolytic capacitor is disposed above the switching module, the reduction in the space for installation has been achieved.

As described above, in a conventional inverter, since an electrolytic capacitor with a large volume has been used, electric connection portion between a capacitor and a switching module, for example, the above-mentioned input conduction plate has a certain length. This electric connection portion has, therefore, inevitably generated an inductance component.

In order to reduce the inductance component, it is preferable to dispose a capacitor in a closer vicinity of the switching module. Accordingly, a capacitor has hitherto been disposed as close as possible to the switching module.

However, since the electrolytic capacitor has a large volume as described above and hence the electric connection portion between the electrolytic capacitor and the switching module has a certain length, there has been a limit to the reduction in inductance component.

SUMMARY OF THE INVENTION

Accordingly, it is an object of the present invention to overcome the above-mentioned drawback associated with the prior art, and to provide a capacitor module for use in an inverter, an inverter, and a capacitor module capable of effectively reducing the inductance component generated in the electric connection portion between the capacitor module and the switching module in an inverter.

A first invention of the present application is a capacitor module for use in an inverter, comprising: a plurality of ceramic capacitors having a first terminal and a second terminal; and a substrate which has a first surface and a second surface opposed to each other, and a plurality of via holes extending through from the first surface to the second surface, and on which the plural ceramic capacitors and a switching module are mounted, wherein: a first conductor is formed on the first surface of the substrate, wherein the first terminals of the plural ceramic capacitors are connected to the first conductor; a second conductor is formed on the second surface of the substrate, wherein the second terminals of the plural ceramic capacitors are connected to the second conductor through the via holes; and first and second terminal mounting portions, where the first and second terminals of the switching module are mounted, are formed on the substrate, wherein the first and second terminal mounting portions are electrically connected to the first and second conductors, respectively.

In a specified aspect of the first invention, the first and second conductor are each formed substantially all over the first and second surfaces.

A substrate constituted of synthetic resin or ceramic is suitable for above-mentioned substrate to be used in the first invention. However, the material for a substrate is not particularly limited to synthetic resin or ceramic.

A second invention of the present application is a capacitor module for use in an inverter, comprising: a plurality of ceramic capacitors having a first terminal and a second terminal; and a substrate which has a first surface and a second surface opposed to each other, and a plurality of via holes extending through from the first surface to the second surface, and on which the plural ceramic capacitors and a switching module are mounted, wherein: the substrate has an insulating sheet, and a first and second metallic plates constituting the first and second conductors laminated on both sides of the insulating sheet, wherein the plural ceramic capacitors are mounted on the first conductor, the first terminals of the plurality of ceramic capacitors being connected to the first conductor; the second terminals of the plurality of ceramic capacitors are connected to the second conductor through the via holes; and first and second terminal mounting portions, where the first and second terminals of the switching module are mounted, are formed on the first and second metallic plates.

In the first and second inventions (hereinafter referred to the present invention), it is preferable that a monolithic capacitor is used as above-mentioned ceramic capacitor.

In a specified aspect of the first and second inventions, at least the portions connected to the first and second terminals of the capacitor, and the first and second mounting portions are exposed on the first and second conductors, and an insulating coating is formed over the remaining area.

More preferably, the insulating coating is constituted of a material having a higher thermal conductivity than air.

In another aspect of the present invention, a synthetic resin having a higher thermal conductivity than air is charged between the ceramic capacitor and the substrate.

In a still another aspect of the present invention, an exterior resin layer for covering the whole of the capacitor module is further provided.

The inverter in accordance with the present invention is characterized in that it comprises a capacitor module in accordance with the first and second inventions, and a switching module which is mounted on the first and second terminal mounting portions disposed on the substrate of the capacitor module.

The capacitor module in accordance with the present invention is characterized in that it comprises: a plurality of ceramic capacitors having a first terminal and a second terminal; and a substrate which has a first surface and a second surface opposed to each other, and a plurality of via holes extending through from the first surface to the second surface, and on which the plural ceramic capacitors are mounted, wherein: a plurality of ceramic capacitors are formed on the first surface of the substrate, wherein a first conductor is formed on the first surface, the first terminals of the plural ceramic capacitors being connected to the first conductor; a second conductor is formed on the second surface of the substrate, wherein the second terminals of the plurality of ceramic capacitors are connected to the first conductors through the via holes.

In the capacitor module in accordance with the present invention, it is preferable that a monolithic capacitor is used as the ceramic capacitor.

BRIEF DESCRIPTION OF THE DRAWINGS

The above and other objects, features and advantages of the present invention will be apparent from the following detailed description of the preferred embodiments of the invention in conjunction with the accompanying drawings, in which.

DESCRIPTION OF THE PREFERRED EMBODIMENTS

Figure 2A:
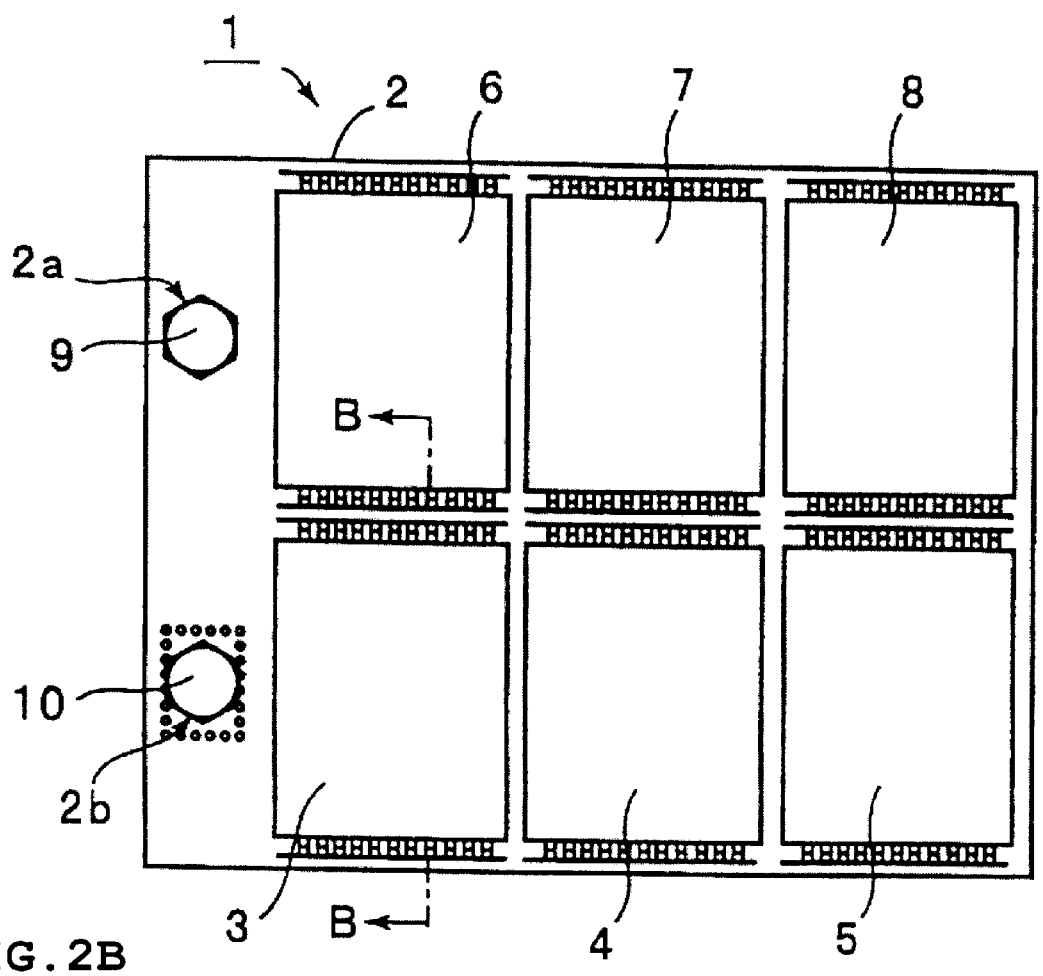
FIGS. 2A and 2B show a plan view and a front view, respectively, of the capacitor module for use in an inverter in the first embodiment.
Figure 2B:
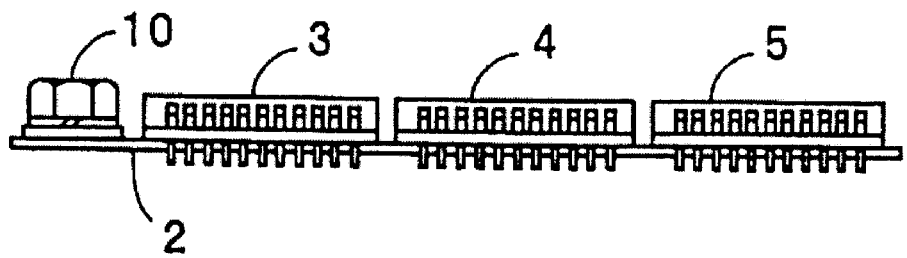

FIGS. 2A and 2B show a plan view and a front view, respectively, of the capacitor module for use in an inverter in accordance with the first embodiment of the present invention.

In the capacitor module 1 for use in an inverter, a plurality of monolithic capacitors 3 to 8 as ceramic capacitors are mounted on a substrate 2. The monolithic capacitors 3 to 8 have first and second lead terminals having polarities different from each other, and each of the first and second lead terminals has many metallic tongue pieces formed by cutting and erecting a metallic plate. First and second terminal mounting portions 2a and 2b are formed on the substrate 2. Here, the first and second terminal mounting portions 2a and 2b are formed as via holes provided in the substrate 2, and bolts 9 and 10 are inserted into the via holes for securing the first and second terminals of a switching module.

A structure in which the monolithic capacitors 3 to 8 are mounted on the substrate 2 is described below with reference to FIGS. 1 and 3. Here, FIG. 1B is a cross-sectional view taken along a line B—B of FIG. 2A.

Figure 1A:
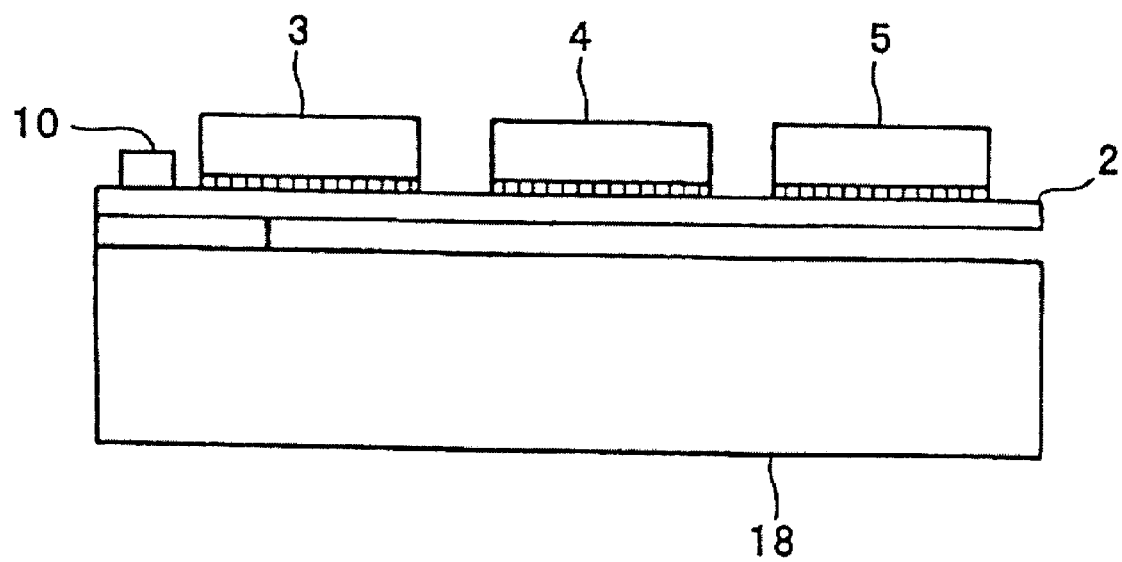
FIGS. 1A and 1B show a frontal sectional views of the critical portions of the capacitor module for use in an inverter in accordance with the first embodiment of present invention.

As illustrated in FIG. 1A, a switching module 18 is disposed under the substrate 2, and monolithic capacitors 3 to 8 are placed so as to be superposed over the top of the switching module 18 through the intermediary of the substrate 2.

Figure 1B:
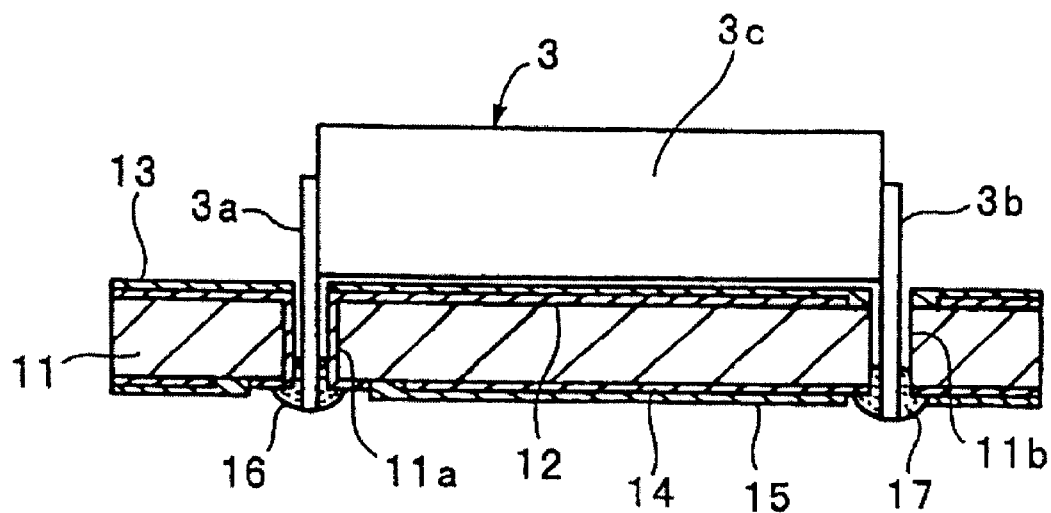

As shown in FIG. 1B, the substrate 2 has a insulative substrate body 11. The insulative substrate body 11 may be constituted of an insulative material other than glass epoxy, for example, synthetic resin such as phenol, or ceramic.

The insulative substrate body 11 has via holes 11a and 11b through which the metallic chips of the first and second lead terminals 3a and 3b of the monolithic capacitor 3 are inserted. The monolithic capacitor 3 is, as described above, formed as a component having leads wherein the first and second lead terminals 3a and 3b are bonded to opposite end faces of the capacitor body 3c.

Figure 3A:
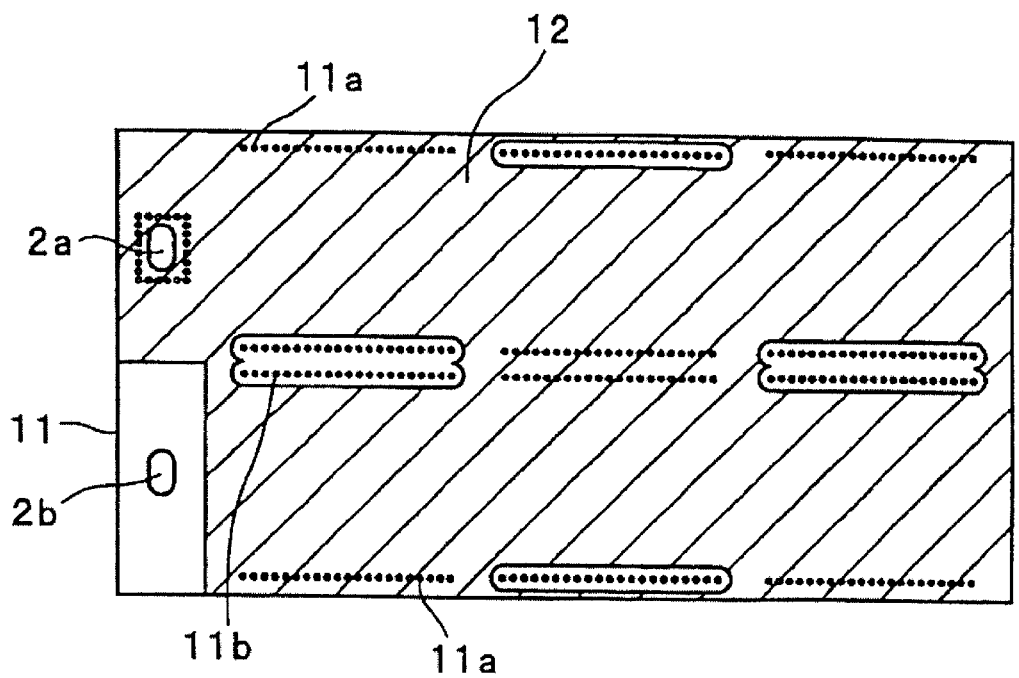
FIGS. 3A and 3B show a plan view and a bottom view respectively for explaining the patterns of the first and second conductors formed on the respective upper and lower surfaces of the substrate used in the first embodiment.

As shown in FIG. 3A, a first conductor substantially all over the upper surface of the insulative substrate body 11, or, the first surface of the substrate in the present invention. Although the first conductor 12 is constituted of Cu in the present embodiment, it may be constituted of another conductive material such as Ag or Al. As shown in FIG. 1B, a first conductor 12 is formed so as to extend to the periphery of the via hole 11a in the lower surface of the glass epoxy substrate 11 through the inner peripheral surface of the via hole 11a. On the other hand, the first conductor 12 is not formed on the periphery of the via hole 11b in the upper surface of the glass epoxy substrate 11 and does not extend within the via hole 11b.

An insulating coating 13 is formed over the abovementioned upper surface of the first conductor 12. The insulating coating 13 is formed over the upper surface of the glass epoxy substrate 11 so as to extend to the periphery of the via hole 11b. This prevents any short circuit between the lead 3b and the first conductor 12. The insulating coating 13 may be formed of, for example, a suitable synthetic resin coating or the like.

Figure 3B:
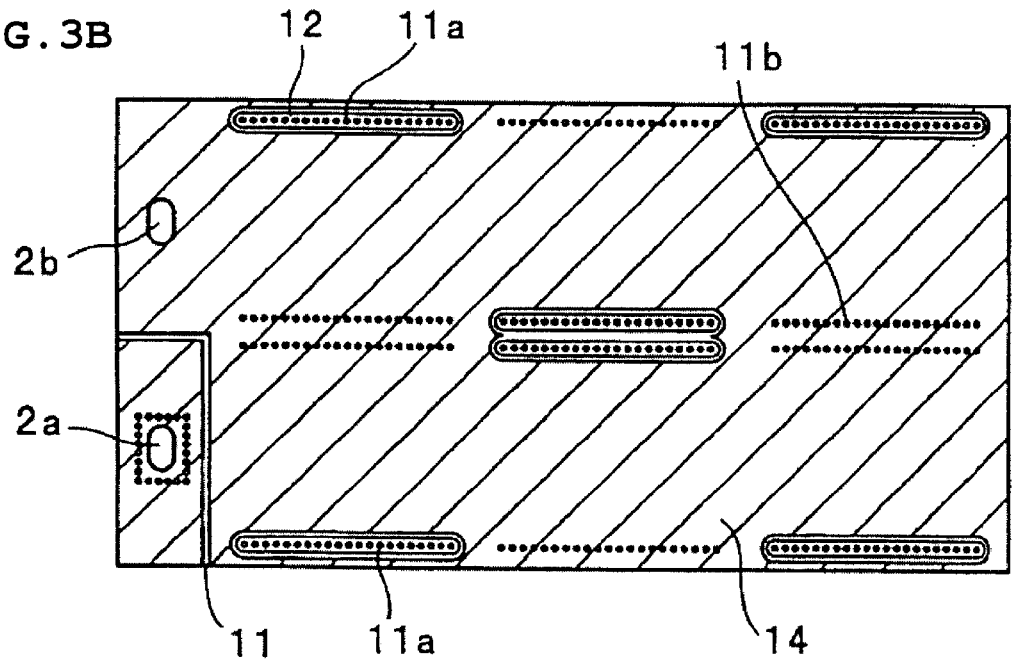

As shown in FIG. 3B, a second conductor 14 is formed substantially all over the lower surface of the glass epoxy substrate 11. The second conductor 14 surrounds the periphery of the via hole 11b on the lower surface of the glass epoxy substrate 11. However, it does not extend to the periphery of the via hole 11a on the lower surface of the glass epoxy substrate 11 and stops at a predetermined distance from that portion of the first conductor 12 which extends onto the lower surface at the periphery of the via hole 11a. The second conductor 14 is constituted of the same material as that of the first conductor 12. However, the second conductor 14 may be constituted of another electrically conductive material.

An insulating coating 15 is formed to cover the second conductor 14 (FIG. 1B). The insulating coating 15 may be constituted of the same material as that of the insulating coating 13. The insulating coating 15 is formed so as to expose the second conductor 14 at the periphery of the opening of the via hole 11b.

Also, the insulating coating 15 is formed so as not to extend onto the first conductor 12 at the periphery of the via hole 11a, in order to expose that portion of the first conductor which has extended onto the lower surface.

The monolithic capacitor 3 is mounted on the substrate 2 so that its lead terminals 3a and 3b are inserted into the via holes 11a and 11b. Herein, the lead terminal 3a is bonded to the first conductor 12 with solder 16. On the other hand, the lead terminal 3b is bonded to the second conductor 14 with solder 17.

The remaining monolithic capacitors 4 to 8 are also mounted on the substrate 2 in the same manner as in the case of the above described capacitor 3.

As is evident from FIG. 1, the lead terminal 3a which is connected to the pole with one potential of the monolithic capacitor 3 is electrically connected to the first conductor 12, and the lead terminal 3b which is connected to the pole with the other potential is electrically connected to the second conductor 14. The first and second conductors 12 and 14 are formed substantially all over the first and second surfaces of the substrate 2, respectively.

Therefore, when constructing an inverter by mounting the switching module 18 on the terminal mounting portions 2a and 2b of the monolithic capacitor module 1, a current flows through the first and second conductors 12 and 14. However, since the first and second conductors are formed so as to cover substantially the whole area of the first and second surfaces of the substrate 2, the first and second conductors permit a large amount of current to flow. Further, since the first and second conductors are formed over the wide area, currents flow in various directions within the first and second conductors, in other words, many branches take place therewithin. Therefore, no matter whether a current flows from the first conductor 12 to the second conductor 14, or the current flows from the second conductor 14 to the first conductor 12, it is possible to suppress the occurrence of inductance components at the electric connection portions constituted of the first and second conductors.

In particular, as in the case of the present embodiment, when the first and second terminal mounting portions 2a and 2b are close to each other, for example, when a current flows through the terminal mounting portion 2b from the first terminal mounting portion 2a to the second terminal mounting portion 2b via the first conductor 12, the monolithic capacitors 3 to 8, and the second conductor 14, the currents flowing through the upper and lower surfaces of the substrate 2 are opposite in direction to each other, thereby effectively offsetting the inductance components generated on both surfaces.

In addition, since much smaller capacitors 3 to 8 than electrolytic capacitors are used, and further since the present embodiment is constituted so that the monolithic capacitors 3 to 8 are mounted on the substrate 2 and the switching module 18 of an inverter is directly mounted on the same substrate 2, it is possible to reduce the size of an inverter, and thus shorten the length of the electric connection portions, which also permits the suppression of the unwanted occurrence of inductance components.

Moreover, since the terminal mounting portions 2a and 2b can be directly fastened to the first and second terminals of the switching module 18 with bolts, it is possible to significantly shorten the distances between the switching module 18 and the capacitors 3 to 8. This also permits the induction component on the power supply route to the capacitors to be reduced.

Furthermore, in the monolithic capacitor module 1, since the monolithic capacitors 3 to 8 are disposed side by side on the substrate 2, it is possible to make large the surface area of the monolithic capacitor module as compared with a capacitor module of multistage structure, thereby increasing the heat dissipation effect.

Referring to FIGS. 4 to 9, there are shown other embodiments of the capacitor modules of the present invention. Each of FIGS. 4 to 9 shows only the portion where single monolithic capacitor is mounted, as in the case of FIG. 1. However, in this embodiment, as in the case of the first embodiment, a plurality of monolithic capacitors are mounted on the substrate, and as in the case of the first embodiment, a first and second terminal mounting portions for mounting a switching module are formed on portions not shown.

Figure 4:
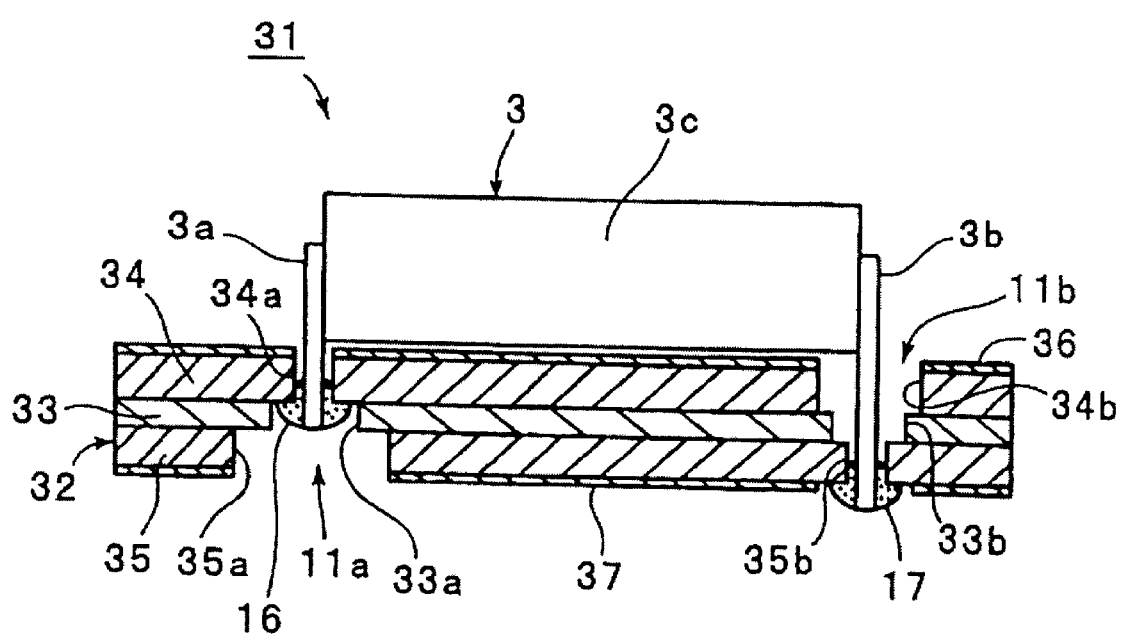
FIG. 4 shows a frontal sectional view of the critical portions of the capacitor module for use in an inverter in accordance with the second embodiment of the present invention.
Figure 6:
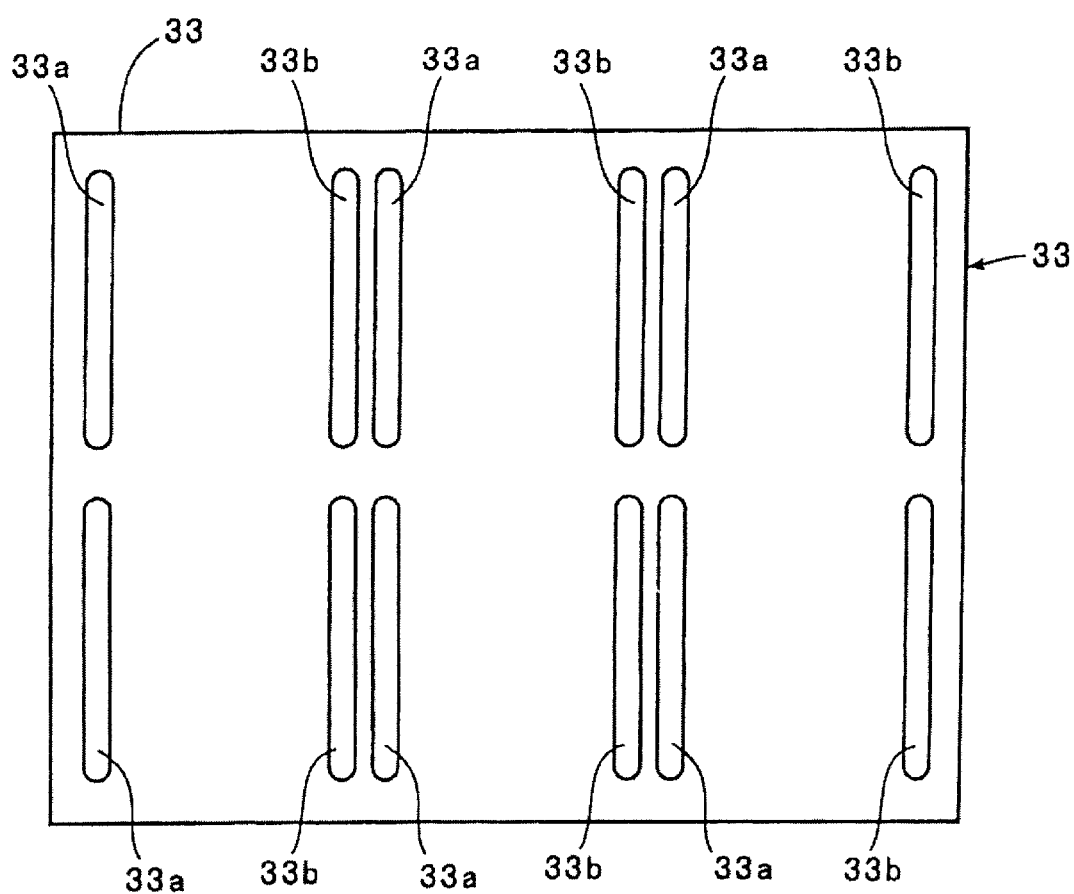
FIG. 6 shows a plan view for explaining the insulating sheet used in the second embodiment.

In the capacitor module 31 of the second embodiment shown in FIG. 4, a substrate 32 has a structure wherein the first and second metallic plates 34 and 35 are stuck on both surfaces of an insulating sheet 33. FIG. 6 shows the insulating sheet 33 in the form of plan view. In the present embodiment, the insulating sheet 33 is constituted of silicone resin with a thickness of about 0.1 mm to 0.05 mm. However, the insulating sheet 33 may be constituted of another synthetic resin such as epoxy resin (resist).

Figure 5A:
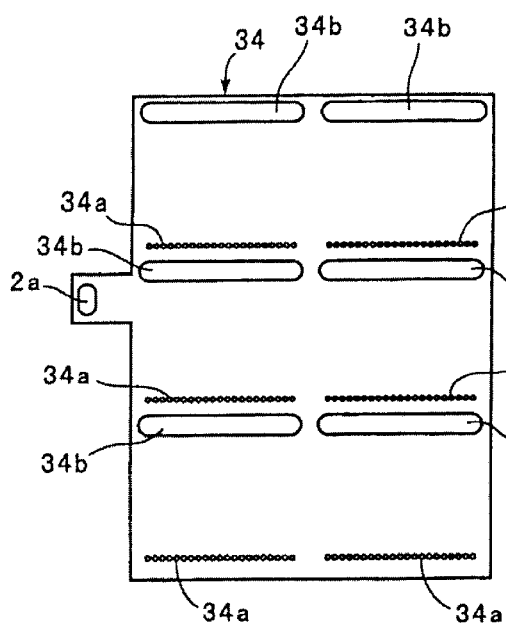
FIGS. 5A and 5B show plan views for explaining the metallic plates used in the first and second embodiments, respectively.
Figure 5B:
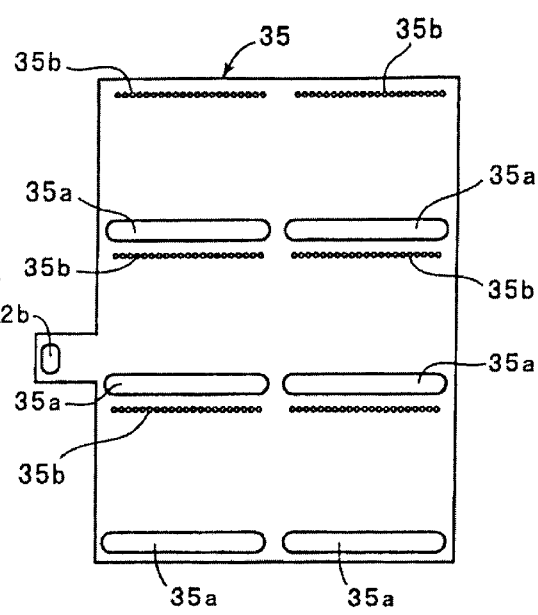

Referring to FIGS. 5A and 5B, there are shown first and second metallic plates 34 and 35. In the present embodiment, the first and second metallic plates 34 and 35 are constituted of Cu plate, and forms the first and second conductors, respectively. The first and second metallic plates 34 and 35 are configured so as to have a thickness of about 0.5 mm.

Thus, a substrate having a structure wherein the first and second metallic plates 34 and 35 are laminated on both surfaces of the insulating sheet 33 may be used. In this case also, an insulating coating 36 is formed over the upper surface of the first metallic plate as the first conductor, and an insulating coating 37 is formed over the lower surface of the second metallic plate 35 as the second conductor.

Via holes 11a and 11b are also formed in the substrate 32. However, in the via hole 11a into which the lead 3a is to be inserted, the diameter of the via hole 34a formed in the first metallic plate 34 is formed smaller than that of the via hole 33a formed in the insulating sheet 35. The via hole 35a of the second metallic plate 35 is formed further larger than the via hole 33a. Therefore, in the state that the lead terminal 3a is inserted, solder 16 can be provided from the lower surface side to bond the lead terminal 3a and the first metallic plate 34 together. In this case, the solder 16 is provided so as to extend onto the lower surface of the first metallic plate 34 and within the via hole 34a, and thereby bonds the lead terminal 3a and the first metallic plate 34 together. Since the via hole 35a is larger than the via hole 33a of the insulating sheet 33, the contact between the solder 16 and metallic plate 35 is prohibited with reliability.

In contrast, in the via hole 11b, the via hole 34b provided in the first metallic plate 34 is formed larger. On the other hand, the via hole 33b and 35b provided in the respective insulating sheet 33 and the second metallic plate 35 are formed smaller in diameter. Therefore, when inserting the lead terminal 3b into the via hole 11b, the contact between the lead terminal 3b and the first metallic plate 34 is reliably prevented. Solder 17 is provided from the lower surface side of the metallic plate 35, and bonds the lead terminal 3b and the second metallic plate 35 together.

Figure 7:
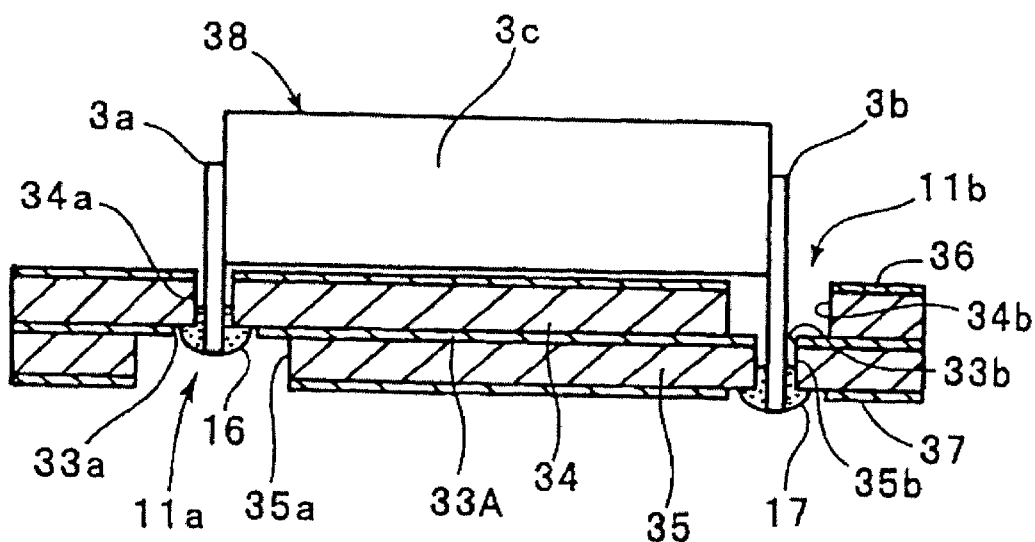
FIG. 7 shows a frontal sectional view of the critical portions of a variant example of capacitor module in accordance with the second embodiment.

Referring to FIG. 7, there is shown a variant example 38 of the capacitor module 31 of the second embodiment. In the capacitor module 38, an insulating sheet 33A is constituted of the same material as that of the insulating sheets 36 and 37. That is, the insulating sheet 33 between the first and second metallic plates 34 and 35 may be constituted of an insulative additive as in the case of the second embodiment, or may be constituted of an insulating coating forming material as in the case of the capacitor module 38.

In this case, the insulating sheet 33A is configured so as to have a thickness of about 0.05 mm.

Figure 8:
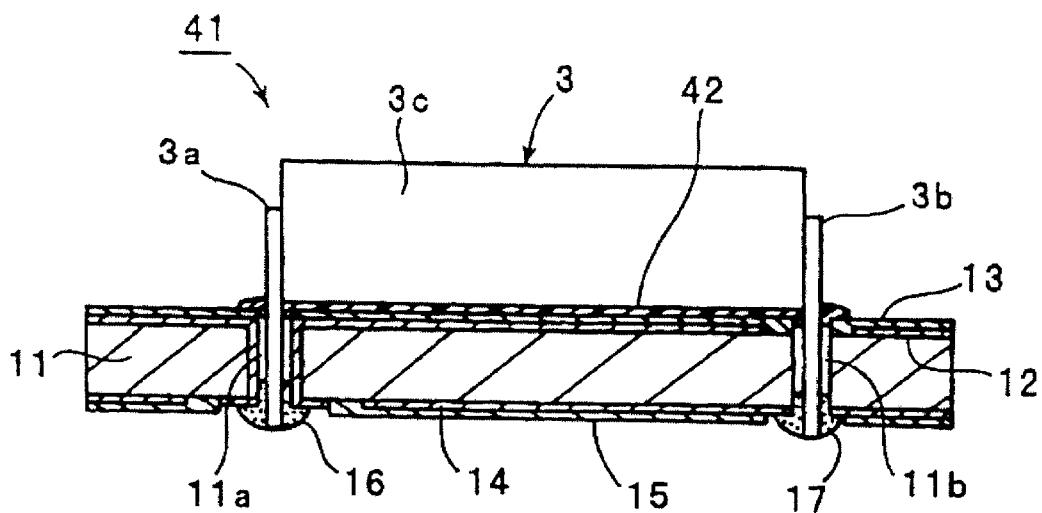
FIG. 8 shows a frontal sectional view for explaining the critical portions of a monolithic capacitor module in accordance with a variant example of the capacitor module of the first embodiment.

Referring to FIG. 8, there is shown a variant example 41 of the monolithic capacitor module in accordance with the first embodiment. In the monolithic capacitor module 41, a synthetic resin 42 having a superior thermal conductivity than air is charged between the substrate 2 and the monolithic capacitor 3. The synthetic resin 42 can be formed by injecting, for example, epoxy resin or silicone resin between the monolithic capacitor 3 and the substrate 2 and curing them. Since the synthetic resin 42 has a higher thermal conductivity than air, the forming of the synthetic resin layer 42 permits the heat dissipation by thermal conduction to be effectively performed. Consequently, the forming of the synthetic resin layer 42 permits the hardening by heat dissipation to be significantly enhanced in comparison with the case of the first embodiment. Furthermore, this embodiment disperses the stresses to which the capacitor 3 and the terminal bonding portions are subjected due to the mechanical vibrations and impacts that the capacitor module 41 undergoes via other devices mounted, and thus exerts a capability of increasing a mechanical-impact resistance.

Figure 9:
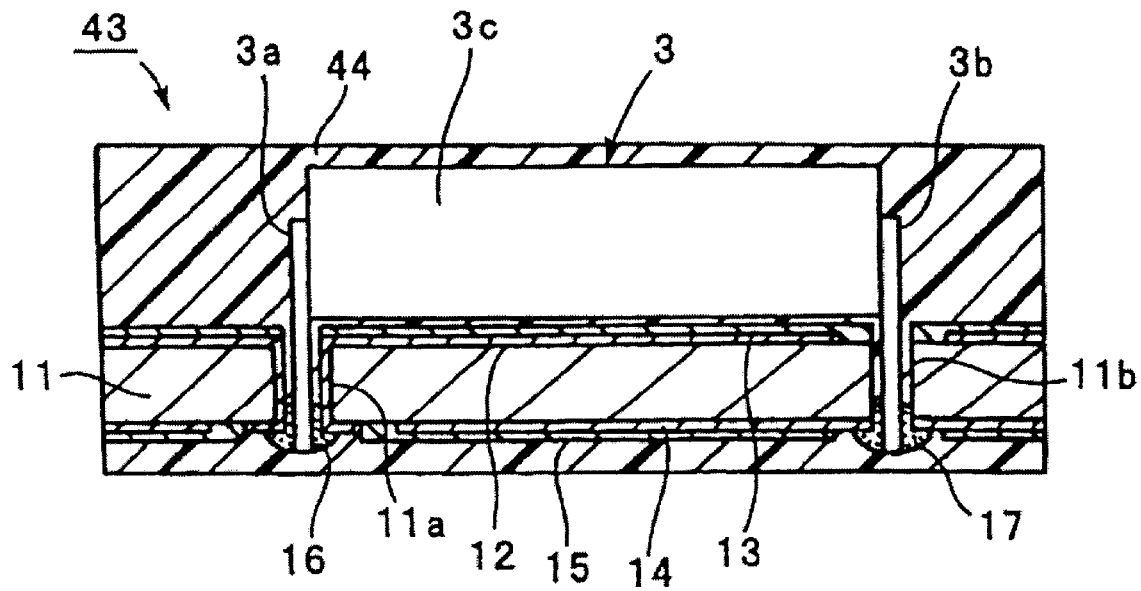
FIG. 9 shows a frontal sectional view of the critical portions of a monolithic capacitor module in accordance with another variant example of the capacitor module of the first embodiment.
Figure 10:
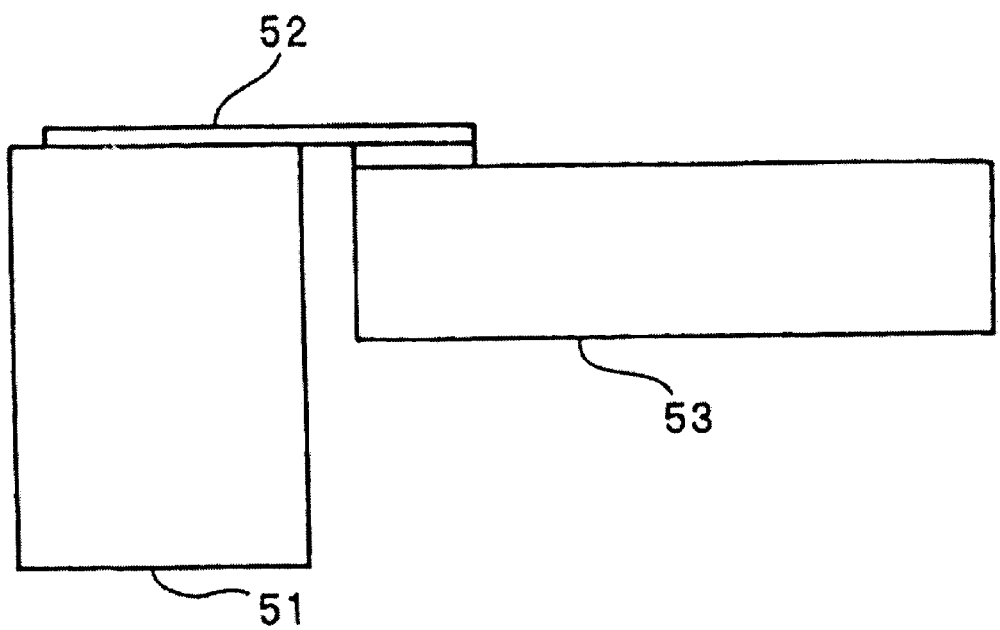
FIG. 10 shows a schematic block diagram of a conventional inverter.

Referring to FIG. 9, there is shown a another variant example 43 of the monolithic capacitor module of the first embodiment. In the monolithic capacitor module 43, the whole thereof is covered with an external resin layer 44. As an external resin layer 44, for example, silicone resin or epoxy resin are used. By covering thus the capacitor module in its entirety with an external resin layer 44, it is possible to enhance the mechanical-impact resistance of the capacitor 3, the lead terminals 3a and 3b, and the portions where a switching module (not shown) is mounted.

Further, since an external resin layer 44 exists between the capacitor body and other components, any short circuit between the capacitor module and other electronic components can be prevented. The external resin layer can also suppress the effects of water, corrosive gases and the like, thereby improving the environmental resistance of this embodiment.

In the above-described embodiments and variant examples, though the first and second conductors are formed substantially all over the first and second surfaces of the substrate, the first and second conductors do not necessarily require to be formed substantially all over these surfaces. Even in the latter case, electric connection portions are constituted of the first and second conductors, and the currents flowing through the first and second conductors becomes opposite in direction to each other, which allows a low-inductance capacitor module for use in an inverter to be constructed.

In the above-described embodiments and variant examples, but monolithic capacitors 3 to 8 are shown as ceramic capacitors, a single-plate type capacitor may also be used as a ceramic capacitor, apart from a monolithic capacitor.

Also, the number of the ceramic capacitors mounted on the substrate in a capacitor module is not limited to that shown in FIG. 2. A suitable number of ceramic capacitors may be mounted in accordance with a target inverter.

Further, for a switching module which is directly mounted on the first and second terminal mounting portion 2a and 2b with bolts, a suitable switching module which has heretofore been used in a known inverter may be employed.

As set forth hereinabove, the advantages of the present invention are as follow.

In the capacitor module for use in an inverter in accordance with the first invention, first and second conductors are formed substantially all over the first and second surfaces of the substrate respectively, and the first terminals of a plurality of ceramic capacitors mounted on the substrate are connected to the first conductor, the second terminals thereof being connected to the second conductor. Herein, the first and second conductors are electrically connected to the respective first and second terminal mounting portions where the first and second terminals of the switching module are mounted.

That is, by forming first and second conductors substantially all over the both surfaces of the substrate, electric connection portions between the ceramic capacitor and the switching module are constituted. Consequently, the currents flowing through the first and second conductors becomes opposite in direction to each other, and hence the inductance components occurred thereby are offset. This allows a low inductance capacitor module for use in an inverter to be provided.

Further, the first conductor is connected to the second conductor through the intermediary of the via holes extending through from the first surface to the second surface of the substrate, and the capacitor module is constituted of much smaller ceramic capacitors than electrolytic capacitors, which allows the reduction in size of the capacitor module for use in an inverter.

In the case where a plurality of ceramic capacitors are mounted side by side on the first surface, they occupy a large surface area, thereby allowing heat dissipation to be increased. The large heat dissipation also permits a large current to flow.

In addition, since a ceramic capacitor can be formed extremely thin in its entirety, the vacant space above the switching module can be effectively utilized.

In the first invention, when the first and second conductors are formed substantially all over the first and second surfaces respectively, it is possible to pass a large current. In this case, since the first and second conductors are formed over a wide area, currents flow in various directions, thereby permitting the occurrence of inductance components in the electric connection portions constituted of the first and second conductors to be more effectively suppressed.

When using synthetic resin or ceramic as a substrate material, it is possible to easily construct, using various molding methods or firing methods, substrates on which the above-mentioned first and second conductors are formed.

Also, in a capacitor module for use in an inverter in accordance with the second invention, the first and second conductors are formed substantially all over the first and second surfaces respectively, and the first terminals of the plurality of ceramic capacitors mounted on the substrate are connected to the first conductor, the second terminals thereof being connected to the second conductor. The first and second conductors are electrically connected to the first and second terminal mounting portions where first and second terminals of the switching module are mounted. The first and second conductors are formed substantially all over the both surfaces of the substrate, and thereby the electric connection portions between the ceramic capacitor and the switching module are constituted.

Therefore, it is possible to pass a large current. Also, since the currents flowing through the first and second conductors are opposite in direction to each other, inductance components generated on both surfaces of the substrate are offset, thereby allowing a low-inductance capacitor module for use in an inverter to be provided.

Further, since the first conductor is connected to the second conductor through the intermediary of the via holes extending through from the first surface to the second surface of the substrate, and since the capacitor module is constituted of much smaller ceramic capacitors than electrolytic capacitors, it is possible to reduce the size of the capacitor module for use in an inverter.

In the case where a plurality of ceramic capacitors are mounted side by side on the first surface, they occupy a large surface area because they are constructed in planar shape, which leads to the increase in heat dissipation. The large heat dissipation also permits a large current to flow.

In addition, since the ceramic capacitor can be formed extremely thin in its entirety, it can be disposed on the switching module, thereby permitting the vacant space above the switching module to be effectively utilized.

Furthermore, in the second invention, since the first and second conductors are constituted of the first and second metallic plates respectively, the substrate has a sufficient strength, thereby enhancing its impact resistance.

When using a monolithic capacitor as a ceramic capacitor in the present invention, it is possible to realize the reduction in size and the increase in capacity of the capacitor, thereby further reducing the size of a capacitor module for use in an inverter.

When exposing at least the portions connected to the first and second terminals of the capacitor and the first and second mounting portions on the first and second conductors, forming an insulating coating on the remaining area, it is possible to reliably prevent undesired short circuits between the first and second terminals and the second conductors or the first conductor by means of the insulating coating.

When using a material having a higher thermal conductivity than air as an insulating coating, it is possible to more enhance the heat dissipation effect through heat conduction by the insulating coating.

When charging a synthetic resin between the ceramic capacitor and the substrate with a synthetic resin having a higher thermal conductivity than air, it is possible to even more increase the heat dissipation effect under the action of thermal conduction of the synthetic resin.

Further when covering the whole of capacitor module with an external resin layer, it is possible to reliably achieve the electric insulation between the capacitor module and other electronic components, and suppress the effects of water, undesired corrosive gases and the like by isolating the capacitor module from external environment, thereby increasing its reliability.

The inverter in accordance with the present invention has a structure in which a switching module is mounted on the first and second terminal mounting portions provided on the substrate of the capacitor module in accordance with the present invention. Therefore, in accordance with the present invention, there is provide a small-sized inverter capable of being employed for a large-current use, and suppressing the occurrence of unwanted inductance components.

In the capacitor module in accordance with the present invention, a large current can be passed, and since the currents flowing through the first and second conductors are opposite in direction to each other, inductance components generated on both surfaces of the substrate are offset, thereby allowing a low-inductance capacitor module to be provided.

When using a monolithic capacitor as the above-described ceramic capacitor, it is possible to realize the reduction in size and the increase in capacity of the capacitor, thereby allowing the size-reduction of a capacitor module in its entirety.

While the invention has been described in its preferred embodiments, obviously many modifications and variations of the present invention are possible in the light of the above teachings. It is therefore to be understood that within the scope of the appended claims, the invention may be practiced otherwise than as specifically described.

What is claimed is:

1. A capacitor module for use in an inverter, said module comprising:
   a planar substrate having first and second opposed surfaces and a plurality of via holes extending from said first to said second opposed surfaces;
   first and second conductors located on said first and second opposed surfaces of said substrate, respectively;
   a plurality of multilayer ceramic capacitors having a planar parallelepiped shapes said ceramic capacitors being mounted on said substrate with the plane of said ceramic capacitors being parallel to said planar substrate, each of said ceramic capacitors having respective first and second terminals which extend through and exit out of respective via holes, said first terminal of each of said ceramic capacitors being electrically coupled to said first conductor, said second terminal of each of said ceramic capacitors being electrically coupled to said second conductor.

2. A capacitor module according to claim 1, wherein each of said first terminals is mechanically coupled to said first conductor and each of said second terminals is mechanically coupled to said second conductor.

3. A capacitor module according to claim 1, wherein each of aid first terminals is mechanically coupled to said first conductor at the point at which it exits said via hole through which it extends and each of said second terminals is mechanically coupled to said second conductor at the point at which it exits said via hole through which it extends.

4. A capacitor module according to claim 1, wherein each of said first terminals is mechanically and electrically coupled to said first conductor by solder and each of said second terminals is mechanically and electrically coupled to said second conductor by solder.

5. A capacitor module according to claim 3, wherein each of said first terminals is mechanically and electrically coupled to said first conductor by solder and each of said second terminals is mechanically and electrically coupled to said second conductor by solder.

6. A capacitor module according to claim 1, wherein each of said first and second terminals are mechanically coupled to said first and second conductors on the same side of said substrate.

7. A capacitor module according to claim 3, wherein each of said first and second terminals are mechanically coupled to said first and second conductors on the same side of said substrate.

8. A capacitor module according to claim 1, wherein said first conductor extends through a plurality of said via holes to said second opposed surface of said conductor and said first and second terminals of said ceramic capacitors are mechanically coupled to said first and second conductors, respectively, at said second opposed surface.

9. A capacitor module according to claim 1, wherein said ceramic capacitors are located on one side of said substrate and said switching module is located on the opposite side of said substrate.

10. A capacitor module according to claim 1, wherein said first conductor has an upper side and a lower side, said lower side facing said first surface of said substrate, each said first terminal being mechanically attached to said lower side of said first conductor at a location inside said via hole through which it extends.

11. A capacitor module according to claim 10, wherein said second conductor has an upper side and a lower side, said upper side facing said second surface of said substrate, each said second terminal being mechanically attached to said lower side of said second surface.

12. A capacitor module according to claim 1, further including insulating coatings on said first and second conductors to avoid short circuiting.

13. A capacitor module according to claim 12, wherein said insulating coatings cover exposed surfaces of said first and second conductors except in the areas where said first and second terminals are coupled to said first and second conductors, respectively.

14. A capacitor module according to claim 13, wherein said first conductor extends through a plurality of said via holes and wherein said insulating coating is not located on the portions of said first conductor extending through said plurality of via holes.

15. A capacitor module according to claim 14, wherein said first conductor extends onto said second surface of said substrate.

16. A capacitor module according to claim 15, wherein said insulating coating does not extend onto that portion of said first conductor which extends onto said second surface of said substrate.

17. A capacitor module according to claim 1, further including a synthetic resin material having a superior thermal conductivity than air located between said first surface and said ceramic capacitors.

18. A capacitor module according to claim 1, wherein each of said first and second terminals extend through a different said via hole.

* * * * *